United States Patent
Inada et al.

(10) Patent No.: US 11,198,160 B2
(45) Date of Patent: Dec. 14, 2021

(54) DETOXIFYING DEVICE, METHOD OF REPLACING PIPING SECTION OF DETOXIFYING DEVICE, AND METHOD OF CLEANING PIPING OF DETOXIFYING DEVICE

(71) Applicant: EBARA CORPORATION, Tokyo (JP)

(72) Inventors: Takanori Inada, Tokyo (JP); Tetsuo Komai, Tokyo (JP); Tetsuro Sugiura, Tokyo (JP)

(73) Assignee: EBARA CORPORATION, Tokyo (JP)

(*) Notice: Subject to any disclaimer, the term of this patent is extended or adjusted under 35 U.S.C. 154(b) by 82 days.

(21) Appl. No.: 16/597,163

(22) Filed: Oct. 9, 2019

(65) Prior Publication Data
US 2020/0114402 A1    Apr. 16, 2020

(30) Foreign Application Priority Data

Oct. 12, 2018 (JP) .............................. JP2018-193042

(51) Int. Cl.
*B08B 9/032* (2006.01)
*B01D 47/06* (2006.01)
(Continued)

(52) U.S. Cl.
CPC .............. *B08B 9/032* (2013.01); *B01D 47/06* (2013.01); *B01D 53/346* (2013.01); *B08B 3/10* (2013.01);
(Continued)

(58) Field of Classification Search
CPC ...... B01D 53/34; B01D 53/346; B01D 53/68; B01D 53/77; B01D 53/78; B01D 47/06;
(Continued)

(56) References Cited

U.S. PATENT DOCUMENTS

| 7,736,440 B2 | 6/2010 | Ikeda et al. |
| 2003/0164560 A1 | 9/2003 | Okuda et al. |

(Continued)

FOREIGN PATENT DOCUMENTS

| EP | 1 142 621 A1 | 10/2001 |
| EP | 1 312 429 A1 | 5/2003 |
| JP | 2004-261777 A | 9/2004 |
| JP | 2004261777 A * | 9/2004 |
| JP | 4012818 B2 | 11/2007 |

OTHER PUBLICATIONS

Google Image search results for "pipe flange o-ring," available at http://www.google.com/search?q=pipe+flange+o-ring (Year: 2021).*
(Continued)

*Primary Examiner* — Mikhail Kornakov
*Assistant Examiner* — Richard Z. Zhang
(74) *Attorney, Agent, or Firm* — Pearne & Gordon LLP (57) ABSTRACT

A detoxifying device 100 having an inner wall 104 that forms a flow passage 103 through which treatment gas flows includes a first piping 130 that forms a part of the flow passage 103, a replaceable piping section 170 that forms a part of the flow passage 103 at the position downstream of the first piping 130, and is connected thereto for sprinkling the cleaning water to remove the solid product adhering to the inner wall 104, and a second piping 150 that forms a part of the flow passage 103 at the position downstream of the piping section 170, and is connected thereto.

14 Claims, 4 Drawing Sheets

(51) Int. Cl.
*B01D 53/34* (2006.01)
*B08B 17/02* (2006.01)
*C23C 16/44* (2006.01)
*B08B 3/10* (2006.01)

(52) U.S. Cl.
CPC ............ *B08B 9/0321* (2013.01); *B08B 17/02* (2013.01); *C23C 16/4407* (2013.01); *C23C 16/4412* (2013.01); *B01D 2257/2066* (2013.01); *B01D 2257/55* (2013.01); *B01D 2257/553* (2013.01); *B01D 2257/556* (2013.01); *B01D 2258/0216* (2013.01)

(58) Field of Classification Search
CPC ................ B01D 47/063; B01D 47/12; B01D 2258/0216; C23C 16/4407; C23C 16/4412; F23J 15/003; F23J 15/006; F23J 2217/50; F23J 15/04; B08B 9/02; B08B 9/032; B08B 9/0321; B08B 17/00; B08B 17/02; B08B 9/027–035; H01L 21/00–86; H01L 21/0262; H01L 21/02263–0228; H01L 21/28194; H01L 21/285–28593; H01L 21/76876
See application file for complete search history.

(56) References Cited

U.S. PATENT DOCUMENTS

| | | | | |
|---|---|---|---|---|
| 2003/0175176 | A1* | 9/2003 | Ikeda | B01D 53/346 422/178 |
| 2006/0032378 | A1* | 2/2006 | Okuda | B01D 47/18 96/282 |
| 2007/0053803 | A1* | 3/2007 | Lee | B01D 47/06 422/168 |
| 2015/0000870 | A1* | 1/2015 | Hosotani | F28D 1/0213 165/104.19 |
| 2019/0046917 | A1* | 2/2019 | Yao | C01D 15/04 |
| 2020/0122085 | A1* | 4/2020 | Maeda | B01D 53/32 |

OTHER PUBLICATIONS

Teikoku Electric website, "About Canned Motor Pump," available at https://web.archive.org/web/20171205110631/http://www.teikokudenki.co.jp/english/pump/ (Year: 2017).*
Extended European Search Report issued in Patent Application No. 19 20 2850.4 dated Mar. 4, 2020.

* cited by examiner

DETOXIFYING DEVICE, METHOD OF REPLACING PIPING SECTION OF DETOXIFYING DEVICE, AND METHOD OF CLEANING PIPING OF DETOXIFYING DEVICE

CROSS-REFERENCE TO RELATED APPLICATION

This application is based upon and claims benefit of priority from Japanese Patent Application No. 2018-193042 filed on Oct. 12, 2018, the entire contents of which are incorporated herein by reference.

TECHNICAL FIELD

The present invention relates to a detoxifying device, a method of replacing a piping section of the detoxifying device, and a method of cleaning piping of the detoxifying device.

BACKGROUND ART

A vacuum pump device has been widely used as one of facilities for manufacturing semiconductors, liquid crystals, solar panels, LEDs, and the like. In the process for manufacturing those products, a vacuum pump is connected to a vacuum chamber to discharge treatment gas in the vacuum chamber through evacuation. The treatment gas to be discharged through evacuation by the vacuum pump contains toxic combustible gas, for example, silane gas ($SiH_4$), dichlorosilane gas ($SiH_2Cl_2$), and ammonia ($NH_3$), or halogen hardly decomposable gas, for example, $NF_3$, $ClF_3$, $SF_6$, $CHF_3$, $C_2F_6$, $CF_4$. The above-described treatment gas through evacuation by the vacuum pump cannot be discharged to the atmosphere as it is. For the purpose of detoxifying the discharged treatment gas through evacuation, a detoxifying device is disposed in a subsequent stage of the vacuum pump. As the process for detoxifying the treatment gas, there have been known the wet process for removing the foreign substance and water-soluble component by bringing the treatment gas in contact with the liquid, and the combustion process for burning the treatment gas.

There may be the case that the substance solidified as a result of the reaction in the vacuum chamber or an easily solidifiable substance as the reaction by-product is mixedly contained in the treatment gas to be discharged from the vacuum pump. Those substances intruding into the detoxifying device may cause clogging of the piping and the detoxifying device, or deteriorate treatment efficiency of the detoxifying device. A foreign substance removing mechanism may be disposed between the vacuum pump device and the detoxifying device for removing the foreign substance.

A fan scrubber is known as one of the foreign substance removing mechanisms. The fan scrubber includes a fan that stirs the treatment gas, a motor for driving the fan, and a nozzle for injecting liquid. The fan scrubber serves to trap the foreign substance in the liquid injected from the nozzle. The fan scrubber functions as the wet detoxifying device as well as the foreign substance removing mechanism.

The treatment gas may contain aluminum chloride ($AlCl_3$), ammonium chloride ($NH_4Cl$), tetraethyl silicate (TEOS) and the like. Because of low steam pressure of the treatment gas at normal temperature, the solid product is generated from the treatment gas inside the piping of the detoxifying device at the lowering temperature. The resultant solid product may adhere to the wall surface of the piping to cause clogging of the piping. There may also be the case that the treatment gas contains $BCl_3$ used for etching Al wiring, or $SiCl_4$ to be discharged upon etching of polysilicon using Cl based gas. The treatment gas as described above reacts with water to generate the solid product. If the inside of the detoxifying device is wet, the resultant solid product may cause clogging of the piping. It is therefore necessary to remove the solid product adhering to the wall surface of the piping. There has been a known detoxifying device having the function of removing the solid product adhering to the wall surface of the piping.

For example, Japanese Patent No. 4012818 discloses the exhaust gas treatment system as an example of the system provided with the detoxifying device with the function of removing the solid product in the piping. The disclosed exhaust gas treatment system includes the semiconductor manufacturing apparatus, the vacuum pump for discharging the gas (treatment gas) from the semiconductor manufacturing apparatus, a wet-type exhaust gas treatment device, a second pipe for connecting the vacuum pump and the wet-type exhaust gas treatment device, and a solid product removing device provided for the second pipe. The solid product removing device includes a tip opening formed in the second pipe, and a cleaning water introduction pipe for supplying the cleaning water from the tip opening to the inner surface of the second pipe. The solid product removing device is configured to wash out the solid product adhering to the inner surface of the second pipe as a result of reaction between the gas (treatment gas) and water content in the pipe using the cleaning water supplied from the tip opening.

SUMMARY OF INVENTION

Technical Problem

The disclosed exhaust gas treatment system is configured to remove the solid product adhering to the wall surface of the piping using the cleaning water. The wall surface of the piping is wet with the cleaning water while it is washed to remove the solid product. Meanwhile, when removal of the solid product is suspended, the wall surface of the piping is dried. The part of the wall surface in the piping through which the cleaning water flows, that is, the part adjacent to the tip opening for supplying the cleaning water is frequently subjected to the wet-dry cycle. A periphery of the tip opening for supplying the cleaning water is more likely to be corroded owing to the wet-dry cycle on the wall surface of the piping compared with the other part of the piping. The use of the detoxifying device in the corroded state may deteriorate the performance of the device, and cause failure of the entire device.

If the PFA coating is applied to the part of the wall surface of the piping frequently subjected to the wet-dry cycle, the corrosion in the coated part is expected to be restrained. The tip opening for supplying the cleaning water is formed in the inner surface of the second pipe, through which the cleaning water flows. The repetitive flow of the cleaning water through the tip opening may cause the risk of exfoliation of the coating from the rim of the tip opening. The exfoliation further leads to corrosion in the wall surface of the piping. The periphery of the opening for supplying the cleaning water whether it is PFA coated or not is likely to be corroded earlier than the other part of the piping.

It is an object of the present invention to provide a detoxifying device capable of restraining performance deterioration of the device and failure of the entire device resulting from the corrosion in the wall surface of piping, a method of replacing the piping section of the detoxifying device, and a method of cleaning piping of the detoxifying device.

Solution to Problem

The detoxifying device according to the present invention has an inner wall that forms a flow passage through which the treatment gas flows. The detoxifying device includes a first piping, a replaceable piping section, and a second piping. The first piping forms a part of the flow passage. The piping section forms a part of the flow passage at a position downstream of the first piping, and is connected thereto. The piping section includes a first stage sprinkling portion for sprinkling a cleaning water to remove a solid product adhering to the inner wall. The second piping forms a part of the flow passage at a position downstream of the piping section, and is connected thereto.

The method of replacing a piping section of the detoxifying device is implemented according to the present invention. The detoxifying device includes an inner wall that forms a flow passage through which treatment gas flows, a first piping that forms a part of the flow passage, a replaceable piping section that forms a part of the flow passage, is positioned downstream of the first piping and connected thereto, and includes a first stage sprinkling portion for sprinkling a cleaning water to remove a solid product adhering to the inner wall, and a second piping that forms a part of the flow passage, and is positioned downstream of the piping section and connected thereto. The method includes a step of replacing the piping section.

The method of cleaning piping of the detoxifying device having an inner wall that forms a flow passage through which treatment gas flows is implemented according to the present invention. The detoxifying device includes a first stage sprinkling portion for sprinkling a cleaning water to remove a solid product adhering to the inner wall, a second stage sprinkling portion positioned upstream of the first stage sprinkling portion for sprinkling the cleaning water to remove the solid product adhering to the inner wall upstream of the first stage sprinkling portion, and a pressure sensor for measuring a pressure in the flow passage upstream of the first stage sprinkling portion. The method includes a step of sprinkling the cleaning water from the first stage sprinkling portion when the pressure sensor detects a pressure higher than a predetermined threshold value, and a step of sprinkling the cleaning water from the second stage sprinkling portion when the treatment gas that causes generation of the solid product stops flowing through the flow passage.

DESCRIPTION OF EMBODIMENTS

Embodiments of the present invention will be described referring to the drawings. The same or corresponding components are denoted as the same reference signs in the drawings, and repetitive explanations thereof, thus will be omitted.

First Embodiment

Structure

Figure 1:
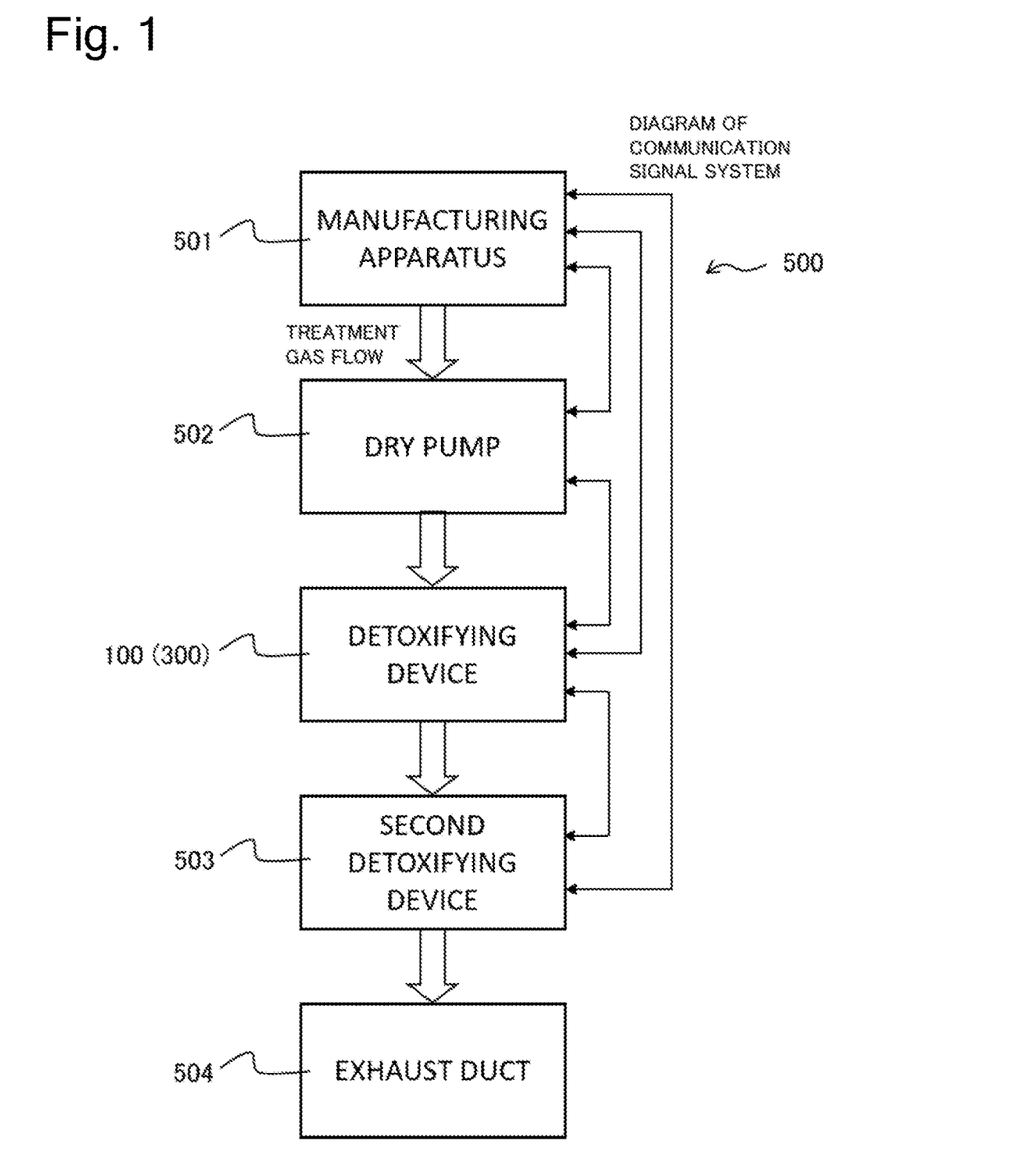
FIG. 1 is a block diagram of a gas treatment system provided with a detoxifying device according to a first embodiment of the present invention.

FIG. 1 is a block diagram of a gas treatment system provided with a detoxifying device according to a first embodiment of the present invention. Referring to FIG. 1, a gas treatment system 500 includes a manufacturing apparatus 501, a dry pump 502, a detoxifying device 100, a second detoxifying device 503, and an exhaust duct 504, all of which are connected with piping sequentially in the order.

When the manufacturing apparatus 501 is operated to execute the predetermined process, the dry pump 502 supplies the treatment gas drawn from the manufacturing apparatus 501 to the detoxifying device 100. Each of the detoxifying device 100 and the second detoxifying device 503 has a function of detoxifying the treatment gas. The exhaust duct 504 discharges the treatment gas flowing from the second detoxifying device 503. The gas treatment system 500 serves to detoxify and discharge the exhaust treatment gas from the manufacturing apparatus 501.

The manufacturing apparatus 501 is electrically connected to the devices in the subsequent stage, that is, the dry pump 502, the detoxifying device 100, and the second detoxifying device 503. The detoxifying device 100 is electrically connected to the dry pump 502 and the second detoxifying device 503. In the gas treatment system 500, the manufacturing apparatus 501, the detoxifying device 100, the dry pump 502, and the second detoxifying device 503 are electrically communicated with one another, and operated associatedly.

Figure 2:
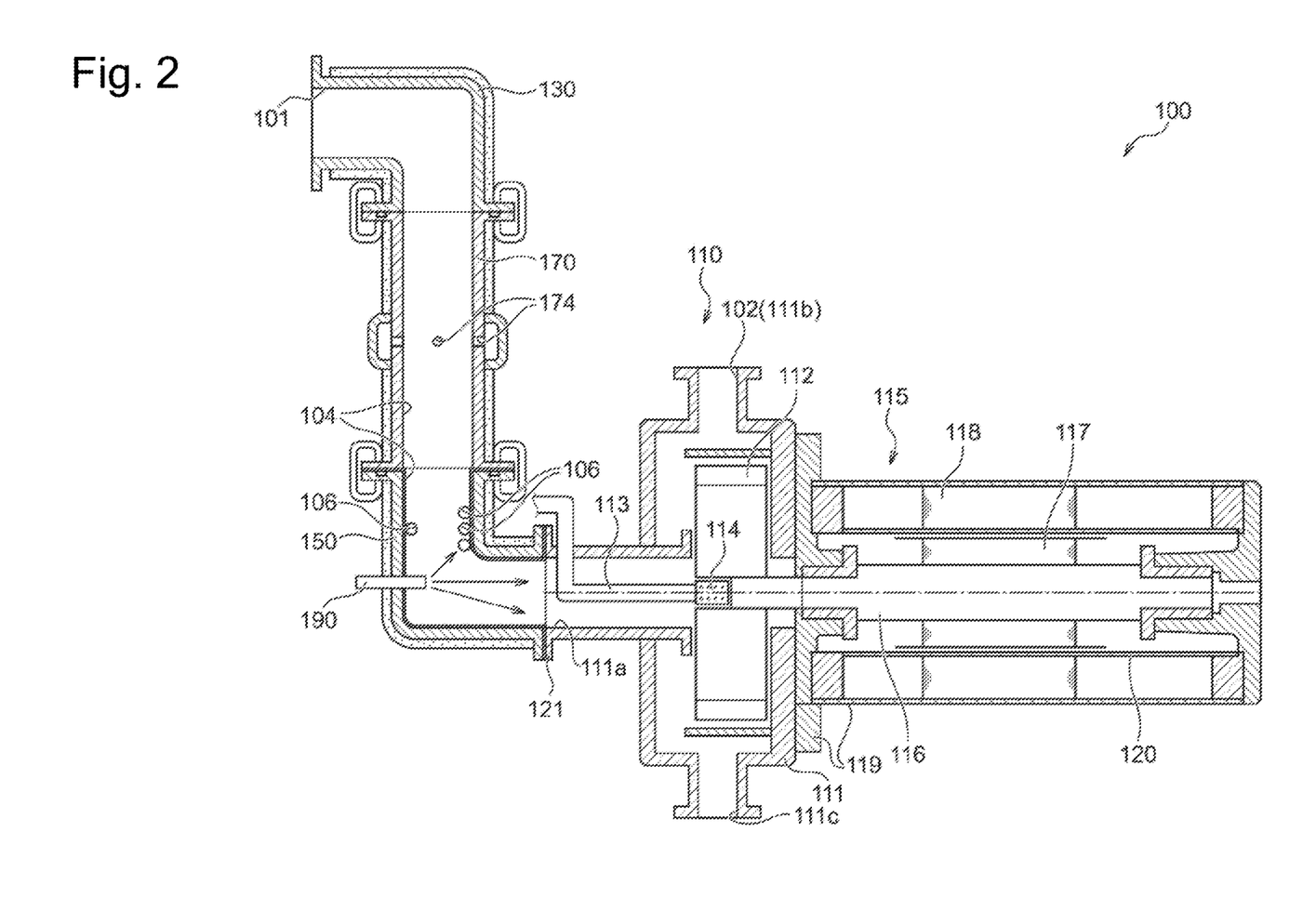
FIG. 2 is a sectional view showing a structure of the detoxifying device according to the first embodiment of the present invention.

FIG. 2 is a sectional view showing a structure of the detoxifying device 100. Referring to FIG. 2, the detoxifying device 100 includes a fan scrubber 110, a first piping 130, a second piping 150, a piping section 170, and a spray 190. The detoxifying device 100 detoxifies the treatment gas drawn from a gas suction port 101, and discharges the detoxified treatment gas from a gas discharge port 102. The detoxifying device 100 may be employed in the facility of manufacturing, for example, for semiconductors, liquid crystals, solar panels, LEDs, and the like.

Components of the detoxifying device 100 will be described.

The fan scrubber 110 includes a casing 111, a fan 112, a liquid supply passage 113, a nozzle 114, and a canned motor 15. The fan scrubber 110 has functions of trapping a foreign substance using the cleaning liquid injected from the nozzle 114, and bringing the treatment gas in contact with the cleaning liquid for detoxification.

The casing 111 includes, for example, a piping connector 111a that draws in the treatment gas, a gas discharge port 111b that discharges the treatment gas, and a liquid discharge port 111c that discharges the cleaning liquid that has been used for detoxifying the treatment gas as waste liquid. The casing 111 covers the fan 112 to define the treatment gas passage.

The fan 112 includes two opposing discs, and a plurality of blades disposed between the discs. The fan 112 turns around the center of the disc to stir the treatment gas in the casing 111.

The liquid supply passage 113 extends from the piping connector 111a to a rotary shaft (main shaft 116 of the canned motor 115) of the fan 112, while having a part positioned adjacent to the second piping 150. The nozzle 114 is attached to an end of the liquid supply passage 113. The liquid supply passage 113 allows communication between a not shown pressure feed mechanism and the nozzle 114. The liquid supply passage 113 supplies the cleaning liquid fed from the pressure feed mechanism to the nozzle 114.

The nozzle 114 includes a plurality of injection ports. The nozzle 114 is disposed to face the rotary shaft (the main shaft 116 of the canned motor 115) of the fan 112 therein. The nozzle 114 injects the cleaning liquid from the injection ports to the inside of the fan 112. Water, known liquid used for cleaning and the like may be used as the cleaning liquid.

The canned motor 115 includes the main shaft 116, a rotor 117, a stator 118 disposed around an outer circumference of the rotor 117, a motor casing 119, and a can 120. The motor casing 119 houses the rotor 117 and the stator 118. The can 120 divides the inner space of the motor casing 119 into a rotor chamber in which the rotor 117 is disposed, and a stator chamber in which the stator 118 is disposed. The main shaft 116 of the canned motor 115 is connected to the fan 112. Accordingly, the fan 112 may be turned by rotation of the canned motor 115. The motor casing 119 and the casing 111 are directly connected. Accordingly, the detoxifying device 100 does not require the magnetic fluid seal to be disposed between the casing 111 and the canned motor 115 for preventing leakage of the treatment gas outside from the casing 111 and the canned motor 115. That is, as the detoxifying device 100 has no magnetic fluid seal, the leakage owing to the magnetic fluid seal never occurs. Although the treatment gas intrudes into the canned motor 115 from the inside of the casing 111 along the main shaft 116, the treatment gas does not come in contact with the stator 118 isolated by the can 120. The detoxifying device 100 is capable of preventing the treatment gas in the casing 111 from damaging the canned motor 115.

Figure 3:
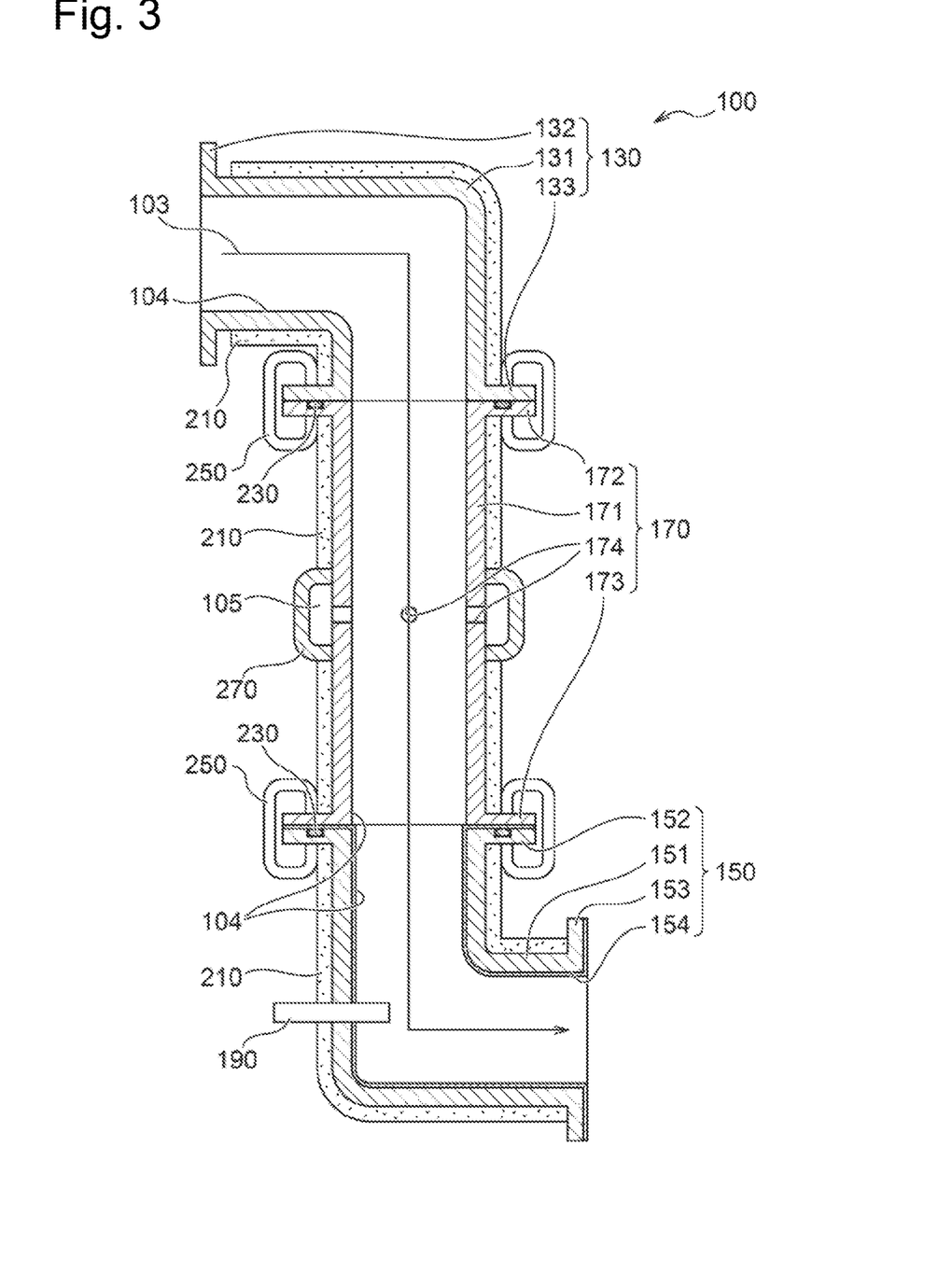
FIG. 3 is an enlarged sectional view showing a periphery of a first piping, a second piping, and a piping section of the detoxifying device as shown in FIG. 2.

FIG. 3 is an enlarged sectional view of a periphery of the first piping 130, the second piping 150, and the piping section 170 of the detoxifying device 100 as shown in FIG. 2. Referring to FIG. 3, an explanation will be made in more detail with respect to the first piping 130, the second piping 150, and the piping section 170.

As FIG. 3 shows, the detoxifying device 100 further includes a heater 210, an O-ring 230, and a clamp 250.

The first piping 130, the second piping 150, and the piping section 170 integrally constitute the flow passage 103 through which the treatment gas flows. In other words, each of the first piping 130, the second piping 150, and the piping section 170 includes an inner wall 104 constituting the flow passage 103 through which the treatment gas flows. The vertically extending flow passage 103 has its upstream side located upper than its downstream side in the direction of gravity.

The first piping 130 includes a pipe-like main body 131, and flanges 132 and 133 at both ends of the main body 131. The first piping 130 constitutes a part of the flow passage 103. The flange 132 is connected to a not shown device for discharging the treatment gas.

The piping section 170 includes a pipe-like main body 171, and flanges 172 and 173 at both ends of the main body 171. The piping section 170 constitutes a part of the flow passage 103, and is positioned downstream of the first piping 130. A corrosion-resistant metal is used for forming the piping section 170. The use of the metal with relatively high corrosion resistance for the piping section 170 allows reduction in the frequency of required replacement of the piping section. The corrosion-resistant metal may be an inconel, SUS316, and the high corrosion-resistant metal used for forming the piping. The inconel exhibits higher corrosion resistance than the SUS316. If the piping section 170 is formed of the inconel, the frequency of the required replacement of the piping section 170 may be reduced compared with the one formed of SUS316. On the contrary, if the piping section 170 is formed of SUS316, the material cost of the piping section 170 becomes lower than the one formed of the inconel. The flange 172 of the piping section 170 and the flange 133 of the first piping 130 are fixed with the clamp 250. The O-ring 230 is attached to the joint between those flanges fixed with the clamp 250. The piping section 170 and the first piping 130 at the joint are tightly in contact with each other with the clamp 250, and further tightly sealed with the O-ring 230. The piping section 170 vertically extends (in the direction of gravity) as shown in FIG. 3, for example. The upward direction of the piping section 170 is denoted as the upstream side, and the downward direction is denoted as the downstream side. The piping section 170 includes a sprinkling portion 174 (first stage sprinkling portion). For example, the sprinkling portion 174 is a through hole positioned in the inner wall 104 of the pipe-like main body 171 while extending in the tangential direction of the inner wall 104. Four sprinkling portions 174 are formed in the circumferential direction of the inner wall 104 of the piping section 170 in a plane perpendicular to the longitudinal direction of the piping section 170 at equal intervals. In other words, the sprinkling portions 174 are formed in the circumference of the inner wall 104 of the piping section 170 at the same height in the vertical direction of FIG. 3 at equal intervals. A sealing ring 270 is fixed to an outer circumference of the piping section 170 while being wound therearound. The sealing ring 270 has a U-like cross section to form a cavity 105 between the sealing ring 270 and the outer circumference of the piping section 170. The cavity 105 covers the holes (sprinkling portions 174) of the piping section 170. That is, the cavity 105 to be formed by the sealing ring 270 is in communication with the holes (sprinkling portions 174). A cleaning water introduction pipe (not shown) for supplying the cleaning water is connected to the cavity 105. The sprinkling portion 174 sprinkles the cleaning water supplied to the cavity 105 from the cleaning water introduction pipe. The cleaning water sprinkled from the sprinkling portion 174 flows to the downstream of the flow passage 103 along the inner wall 104. This allows the cleaning water to wash out the solid product adhering to the inner wall 104. In other words, the sprinkling portion 174 sprinkles the cleaning water to allow the solid product adhering to the inner wall 104 to be removed. Water is used as the cleaning water, but a chemical solution for cleaning may also be used. The detoxifying device 100 has the sprinkling portion 174 as described above. However, the sprinkling portion 174 does not have to be structured as described above so long as the cleaning water can be sprinkled into the flow passage 103. For example, the sprinkling portion 174 may be formed into a nozzle-like shape to be disposed inside the flow passage 103.

The sprinkling portion 174 keeps blowing drying gas while sprinkling of the cleaning water is suspended. More specifically, the sprinkling portion 174 blows the drying gas for the fixed period from the end of sprinkling the cleaning water constantly at a first flow rate. After an elapse of the fixed period, the drying gas is blown at a second flow rate that is lower than the first flow rate. As the drying gas, inert gas, specifically, nitrogen may be used.

The second piping 150 includes a pipe-like main body 151, and flanges 152 and 153 at both ends of the main body 151. A PFA coating 154 is applied to the inner wall 104 of the second piping 150. This makes it possible to restrain corrosion in the inner wall 104 of the second piping 150. This also prevents the solid product from adhering to the inner wall 104 of the second piping 150, and further prevents the cleaning water that has been flown from remaining on the inner wall 104 of the second piping 150. The second piping 150 constitutes a part of the flow passage 103 downstream of the piping section 170. The flange 152 of the second piping 150 and the flange 173 of the piping section 170 are fixed with the clamp 250. The O-ring 230 is attached to the joint between those flanges fixed with the clamp 250. The piping section 170 and the second piping 150 at the joint are tightly in contact with each other with the clamp 250, and further tightly sealed with the O-ring 230. The clamp 250 and the O-ring 230 allow the piping section 170 and the second piping 150 to be connected by a simple structure. The flange 153 is connected to the flange 121 (see FIG. 2) of the fan scrubber 110.

In the above-structured detoxifying device 100, the treatment gas drawn from the gas suction port 101 of the first piping 130 passes through the first piping 130, the piping section 170, and the second piping 150 sequentially to be supplied to the piping connector 111a of the fan scrubber 110 (see FIG. 2).

The spray 190 is disposed in the flow passage 103 downstream of the sprinkling portion 174 to allow the sprinkling of the cleaning water toward the liquid supply passage 113 (see FIG. 2). More specifically, the spray 190 is disposed adjacent to the part of the inner wall 104, on which the cleaning water sprinkled from the sprinkling portion 174 flows. In the detoxifying device 100, the spray 190 is disposed inside the second piping 150, for example. The spray 190 sprinkles the cleaning water toward the liquid supply passage 113 to remove the solid product adhering thereto.

The heater 210 is wound around the respective outer walls of the first piping 130, the second piping 150, and the piping section 170. The heater 210 heats the inner wall 104 to a predetermined temperature. The predetermined temperature is set in accordance with the treatment gas used for the treatment to be executed by the detoxifying device 100 to hinder generation of the solid product from the treatment gas. In other words, if the inner wall 104 is at the predetermined temperature, the solid product is unlikely to be generated on the inner wall 104.

Operation for Removing Solid Product

An operation for removing the solid product in the detoxifying device 100 will be described again referring to FIG. 2.

The detoxifying device 100 is configured to inject the cleaning liquid from the nozzle 114 of the fan scrubber 110 as mentioned above. As the cleaning liquid is supplied from the liquid supply passage 113, the temperature of the outer surface of the liquid supply passage 113 is lowered to make the solid product likely to adhere to the outer wall of the liquid supply passage 113. The cleaning water is sprinkled from the spray 190 to the outer surface of the liquid supply passage 113 to remove the solid product adhering to the outer wall of the liquid supply passage 113.

The spray 190 sprinkles the cleaning water dispersedly. The cleaning water partially becomes droplets to adhere to a part of the inner wall 104 adjacent to the spray 190. On the part where the spray 190 sprinkles the cleaning water at high flow rate, the sprinkled cleaning water will wash out the droplets of the cleaning water adhering to the inner wall 104. Therefore, on the part subjected to the sprinkled cleaning water at the high flow rate, the adhering droplets will be washed out before the solid product is grown into the substantially large size. As a result, the solid product generated from the treatment gas does not adhere to the inner wall. Meanwhile, on the part where the cleaning water sprinkled from the spray 190 flows at the low flow rate, the droplets of the cleaning water adhering to the inner wall 104 cannot be washed out sufficiently. On the above-described part where the cleaning water sprinkled from the spray 190 flows at the low flow rate, the treatment gas reacted with the droplets may generate the solid product (for example, the solid product 106 in FIG. 2) that is large enough to cause clogging of the flow passage. The detoxifying device 100 is provided with the sprinkling portion 174 upstream of the spray 190. Therefore, the cleaning water sprinkled from the sprinkling portion 174 vertically flows downward along the inner wall 104. The sprinkling portion 174 allows the cleaning water to flow on the part to which the solid product adheres so that the adhering solid product is removed. The time or time interval for sprinkling the cleaning water from the sprinkling portion 174 may be arbitrarily determined in accordance with the component of the treatment gas, and size or length of the flow passage.

The sprinkling portion 174 blows the drying air at the first flow rate for a fixed period from the end of sprinkling the cleaning water. After an elapse of the fixed period, the sprinkling portion 174 blows the drying air at the second flow rate. The detoxifying device 100 allows the sprinkling portion 174 to blow the drying air at the first flow rate higher than the second flow rate at the end of sprinkling the cleaning water. This allows the inner wall 104 that has been wetted with the cleaning water to be quickly dried, and prevents the solid product as the cleaning water remaining on the inner wall 104 from newly adhering after introducing the cleaning water. When sprinkling of the cleaning water from the sprinkling portion 174 is suspended, the detoxifying device 100 allows the sprinkling portion 174 to blow the drying gas constantly to prevent intrusion of the treatment gas into the sprinkling portion 174. The heater 210 heats the inner wall 104 to be quickly dried.

Method of Replacing Piping Section

A method of replacing the piping section 170 will be described referring to FIG. 3.

As described above, in the detoxifying device 100, because of sprinkling taking place from the sprinkling portion 174, the part of the inner wall 104 adjacent to the sprinkling portion 174 is frequently subjected to the cycle of wetting with the sprinkled cleaning water and drying. This may cause the part to be corroded.

If the part of the inner wall 104 adjacent to the sprinkling portion 174 is corroded, the clamps 250 at both ends of the piping section 170 with the corroded part are removed. Then the piping section 170 with the corroded part is detached from the first piping 130 and the second piping 150. Thereafter, the non-corroded piping section 170 is interposed between the first piping 130 and the second piping 150, and fixed at both ends using the respective clamps 250.

The detoxifying device 100 allows replacement of only the piping section 170 that is likely to be corroded. The detoxifying device 100 ensures to maintain the easily corrosible part adjacent to the sprinkling portion 174 in the non-corroded state by the replacement. That is, the detoxifying device 100 prevents performance deterioration of the device or failure of the entire device owing to corrosion in the inner wall 104 of the pipe.

Modified Example

In the present embodiment, the detoxifying device 100 includes the fan scrubber 110 for treating the treatment gas.

However, the detoxifying device 100 does not necessarily require the fan scrubber 110 so long as a mechanism for treating the treatment gas is provided.

In the detoxifying device 100, the heater 210 is wound around the outer walls of the first piping 130, the second piping 150, and the piping section 170 entirely. The heater 210 does not have to be wound around the entire outer wall, but may be disposed only to the part required to be heated.

Second Embodiment

Structure

Figure 4:
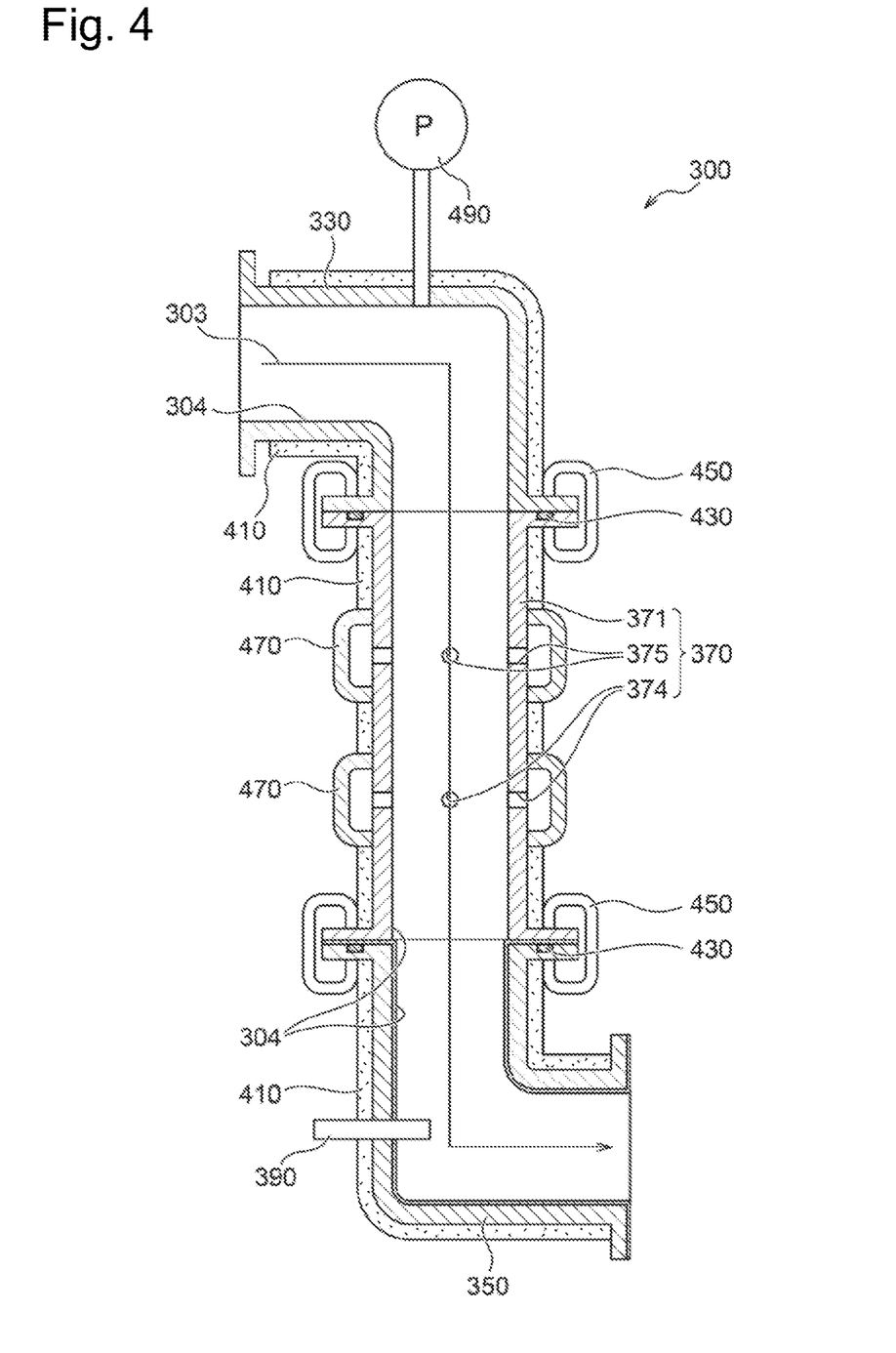
FIG. 4 is an enlarged sectional view showing a periphery of a piping section of a detoxifying device according to a second embodiment of the present invention.

A detoxifying device according to a second embodiment of the present invention has the same structure as that of the detoxifying device 100 according to the first embodiment except the piping section and a pressure sensor.

FIG. 4 is an enlarged sectional view showing a periphery of the piping section of the detoxifying device according to the second embodiment of the present invention. A detoxifying device 300 of the second embodiment will be described in detail referring to FIG. 4.

The detoxifying device 300 includes a first piping 330, a second piping 350, a piping section 370, a heater 410, an O-ring 430, a clamp 450, a spray 390, and a pressure sensor 490. The first piping 330, the second piping 350, the heater 410, the O-ring 430, the clamp 450, and the spray 390 are the same as those described in the first embodiment.

The piping section 370 is provided with all components constituting the piping section 170 as described in the first embodiment, and further includes a second stage sprinkling portion 375 upstream of a first stage sprinkling portion 374 (corresponding to the sprinkling portion 174 as described in the first embodiment).

Likewise the first stage sprinkling portion 374, the second stage sprinkling portion 375 is a through hole positioned in an inner wall 304 of the pipe-like main body 371 while extending in the tangential direction of the inner wall 304. Four second stage sprinkling portions 375 are formed in the circumference direction of the inner wall 304 of the piping section 370 in a plane perpendicular to the longitudinal direction of the piping section 370 at equal intervals. In other words, the first stage sprinkling portions 374 are formed in the circumference of the inner wall 304 of the piping section 370 at the same height in the vertical direction of FIG. 4 at equal intervals. A sealing ring 470 is wound around the part of the second stage sprinkling portion 375 likewise the first stage sprinkling portion 374. The cleaning water may be sprinkled from the second stage sprinkling portion 375. The cleaning water sprinkled from the second stage sprinkling portion 375 flows to the downstream of the flow passage 303 along the inner wall 304. The second stage sprinkling portion 375 is positioned upstream of the first stage sprinkling portion 374. The second stage sprinkling portion 375 sprinkles the cleaning water to remove the solid product adhering to the inner wall 304 upstream of the first stage sprinkling portion 374. The second stage sprinkling portion 375 does not have to be structured similarly to the sprinkling portion 174 as described in the first embodiment so long as the cleaning water can be sprinkled into a flow passage 303.

As described above, the detoxifying device 300 has the second stage sprinkling portions 375 included in the piping section 370. Although a part of the piping section 370 adjacent to the second stage sprinkling portion 375 is corroded thereby, the corroded part may be easily replaced by replacing the piping section 370.

The pressure sensor 490 is disposed at the position which allows measurement of the internal pressure of the flow passage 303 upstream of the first stage sprinkling portion 374, and measures the pressure of the flow passage upstream of the first stage sprinkling portion 374.

The detoxifying device 300 sets each timing of sprinkling the cleaning water from the first stage sprinkling portion 374 and the second stage sprinkling portion 375. The detoxifying device 300 includes a controller (not shown) that controls each timing of sprinkling the cleaning water from the first stage sprinkling portion 374 and the second stage sprinkling portion 375. Specifically, the first stage sprinkling portion 374 sprinkles the cleaning water when the pressure sensor 490 measures the pressure higher than the predetermined threshold value. Meanwhile, the second stage sprinkling portion 375 sprinkles the cleaning water when the treatment gas that causes generation of the solid product stops flowing through the flow passage 303. The detoxifying device 300 regards the timing when a process gas stop signal is received from the manufacturing apparatus 501 disposed in the prior stage of the detoxifying device 300 as the timing when the treatment gas that causes generation of the solid product stops flowing (see FIG. 1). The detoxifying device 300 may be configured to regard the timing when the process gas stop signal is received from the dry pump 502 disposed in the prior stage of the detoxifying device 300 or the second detoxifying device 503 disposed in the subsequent stage of the detoxifying device 300 as the timing when the treatment gas stops flowing (see FIG. 1). The detoxifying device 300 may also be configured to measure the wind speed in the flow passage 303, and regard the timing when the measured wind speed becomes equal to or lower than the fixed threshold value as the timing when the treatment gas that causes generation of the solid product stops flowing.

Operation for Removing Solid Product

An operation of the detoxifying device 300 for removing the solid product will be described.

Likewise the detoxifying device 100, in the detoxifying device 300, the cleaning water sprinkled from the spray 390 may adhere to a part of the inner wall 304 of the second piping 350. As a result, the solid product may adhere to the part of the inner wall 304 of the second piping 350. The solid product adhering to the inner wall 304 grows larger with the passage of time, resulting in narrowing of the flow passage 303 through which the treatment gas flows. This makes it difficult for the treatment gas to flow, and increases the pressure in the flow passage upstream of the second piping 350 to which the solid product adheres. The pressure sensor 490 measures the increased pressure. When the pressure sensor 490 measures the pressure higher than the predetermined threshold value, the cleaning water is sprinkled from the first stage sprinkling portion 374. At the timing when a certain amount of the solid product has adhered to the inner wall 304, the first stage sprinkling portion 374 sprinkles the cleaning water. That is, the first stage sprinkling portion 374 is capable of removing the solid product by estimating the amount of the solid product adhering to the inner wall 304 based on the pressure. This ensures to prevent the solid product from causing clogging of the piping. The threshold value of the pressure, based on which the first stage sprinkling portion 374 starts sprinkling the cleaning water is arbitrarily determined in accordance with the flow rate required to allow the flow of the treatment gas.

The cleaning water sprinkled from the first stage sprinkling portion 374 becomes droplets splashing around the first stage sprinkling portion 374. The splashed droplets of the cleaning water may adhere to the part upstream of the first stage sprinkling portion 374. The droplets adhering to the part upstream of the first stage sprinkling portion 374 react with the treatment gas to generate the solid product upstream of the first stage sprinkling portion 374. The resultant solid product is positioned upstream of the first stage sprinkling portion 374. It is therefore difficult to remove the solid product by sprinkling the cleaning water from the first stage sprinkling portion 374. In the present embodiment, the detoxifying device 300 includes the second stage sprinkling portion 375. The second stage sprinkling portion 375 sprinkles the cleaning water to remove the solid product adjacent to the first stage sprinkling portion 374 downstream of the second stage sprinkling portion 375. That is, the detoxifying device 300 allows the second stage sprinkling portion 375 to remove the solid product that has adhered by sprinkling the cleaning water from the first stage sprinkling portion 374.

In the detoxifying device 300, the second stage sprinkling portion 375 sprinkles the cleaning water when the treatment gas that causes generation of the solid product stops flowing through the flow passage 303. The treatment gas stops flowing through the flow passage 303 upon suspension of supplying the treatment gas from the device disposed in the prior stage of the detoxifying device 300. That is, the detoxifying device 300 is capable of removing the solid product that has adhered by sprinkling the cleaning water from the second stage sprinkling portion 375 upon suspension of supplying the treatment gas from the device in the prior stage. Generally, the device for supplying the treatment gas stops supplying the treatment gas at the end of executing the predetermined process. The detoxifying device 300 is capable of removing the solid product regularly at the end of the predetermined process executed by the device in the prior stage. As described above, the detoxifying device 300 regards the timing when receiving the process gas stop signal from the manufacturing apparatus 501 disposed in the prior stage of the detoxifying device 300 as the timing when the treatment gas that causes generation of the solid product stops flowing. The solid product adhering by sprinkling the cleaning water from the first stage sprinkling portion 374 may be removed regularly when the dry pump 502 disposed in the prior stage stops supplying the treatment gas.

Method of Cleaning Piping of Detoxifying Device

The method of cleaning the piping of the detoxifying device 300 will be described.

When the manufacturing apparatus 501 in the prior stage of the detoxifying device 300 executes the predetermined process, the dry pump 502 supplies the treatment gas to the detoxifying device 300. The treatment gas flows through the flow passage 303 while reacting with water to generate the solid product on the inner wall 304. As a result, the pressure detected by the pressure sensor 490 is increased. When the pressure sensor 490 detects the pressure higher than the predetermined threshold value, the first stage sprinkling portion 374 sprinkles the cleaning water. The first stage sprinkling portion 374 ensures to prevent the solid product from causing clogging of the part of the piping downstream of the first stage sprinkling portion 374. At the end of the predetermined process executed by the manufacturing apparatus 501, the manufacturing apparatus 501 transmits the process gas stop signal to the detoxifying device 300. The detoxifying device 300 regards the reception of the process gas stop signal as the timing when the treatment gas that causes generation of the solid product stops flowing. Then the second sprinkling portion 375 sprinkles the cleaning water. The detoxifying device 300 is capable of removing the solid product that has adhered by sprinkling the cleaning water from the first stage sprinkling portion 374 regularly at the end of the predetermined process executed by the manufacturing apparatus 501.

Modified Example

In the detoxifying device 300, the second sprinkling portion 375 starts sprinkling the cleaning water when the treatment gas that causes generation of the solid product stops flowing through the flow passage 303. The timing for starting sprinkling the cleaning water by the second stage sprinkling portion 375 may be arbitrarily determined in a non-restricted manner. For example, the second stage sprinkling portion 375 is allowed to start sprinkling the cleaning water when receiving the predetermined signal from the device in the prior stage. Specifically, assuming that the device in the prior stage of the detoxifying device 300 is the semiconductor manufacturing apparatus, it is possible to set the sprinkling start timing in synchronization with the end of the deposition process. The deposition process refers to the process for depositing impurities at predetermined concentration to the silicon surface. The detoxifying device 300 is capable of removing the solid product at the end of executing the deposition process.

EMBODIMENTS

The above-described embodiments may be configured as described below partially or entirely in a non-restricted manner.

Embodiment 1

The detoxifying device according to Embodiment 1 has the inner wall that forms the flow passage through which the treatment gas flows. The detoxifying device includes a first piping, a replaceable piping section, and a second piping. The first piping forms a part of the flow passage. The piping section forms a part of the flow passage at a position downstream of the first piping, and is connected thereto. The piping section includes a first stage sprinkling portion for sprinkling a cleaning water to remove a solid product adhering to the inner wall. The second piping forms a part of the flow passage at a position downstream of the piping section, and is connected thereto.

In the detoxifying device according to Embodiment 1, the first stage sprinkling portion is included in the replaceable piping section. Although corrosion occurs in the part adjacent to the first stage sprinkling portion resulting from removing the solid product adhering to the inner wall, the corroded part may be easily replaced by replacing the piping section. This allows the wall surface of the piping to be kept in the non-corroded state. The detoxifying device is capable of restraining performance deterioration of the device or failure of the entire device owing to the corrosion in the wall surface of the piping.

Embodiment 2

A detoxifying device according to Embodiment 2 is the detoxifying device according to Embodiment 1, further including a heater for heating the inner wall.

The detoxifying device according to Embodiment 2 allows the heater to heat the inner wall to restrain adhesion of the solid product to the inner wall.

Embodiment 3

A detoxifying device according to Embodiment 3 is the detoxifying device according to Embodiment 1 or 2, wherein the piping section is made of a corrosion-resistant metal.

In the detoxifying device according to Embodiment 3, the use of the metal with relatively high corrosion resistance for the piping section allows reduction in the frequency of required replacement of the piping section.

Embodiment 4

A detoxifying device according to Embodiment 4 is the detoxifying device according to any one of Embodiments 1 to 3, wherein a PFA coating is applied to the inner wall corresponding to the second piping.

In the detoxifying device according to Embodiment 4, the PFA coating is applied to the part on the inner wall of the second piping for restraining corrosion in the inner wall of the second piping.

Embodiment 5

A detoxifying device according to Embodiment 5 is the detoxifying device according to any one of Embodiments 1 to 4, further including an O-ring that tightly seals a joint between the piping section and the first or the second piping, and a clamp that brings the piping section in tight contact with the first or the second piping at the joint.

In the detoxifying device according to Embodiment 5, the piping section is connected to the first or the second piping with a simple structure using the O-ring and the clamps. The piping section may be easily detached by removing the clamps. The newly provided piping section after the replacement may be easily fixed with the clamps.

Embodiment 6

A detoxifying device according to Embodiment 6 is the detoxifying device according to any one of Embodiments 1 to 5, further including a second stage sprinkling portion positioned upstream of the first stage sprinkling portion for sprinkling the cleaning water to remove the solid product adhering to the inner wall upstream of the first stage sprinkling portion.

In the detoxifying device, the cleaning water sprinkled from the first stage sprinkling portion splashes to possibly generate the solid product in the part upstream of the first stage sprinkling portion. In the detoxifying device according to Embodiment 6, the use of the second stage sprinkling portion may remove the solid product that has adhered by sprinkling the cleaning water from the first stage sprinkling portion.

Embodiment 7

A detoxifying device according to Embodiment 7 is the detoxifying device according to Embodiment 6, further including a pressure sensor for measuring a pressure in the flow passage upstream of the first stage sprinkling portion. The first stage sprinkling portion sprinkles the cleaning water when the pressure sensor detects a pressure higher than a predetermined threshold value. The second stage sprinkling portion sprinkles the cleaning water when the treatment gas that causes generation of the solid product stops flowing through the flow passage.

When the width of the flow passage through which the treatment gas flows in the piping is narrowed by the solid product adhering to the wall surface of the piping in the detoxifying device, the pressure in the flow passage increases. The detoxifying device according to Embodiment 7, allows the pressure sensor to measure the pressure increase in the flow passage, and further allows the first stage sprinkling portion to remove the solid product as needed. Since the second stage sprinkling portion sprinkles the cleaning water when the treatment gas that causes generation of the solid product stops flowing through the flow passage, the detoxifying device is capable of removing the solid product that has adhered by sprinkling the cleaning water from the first stage sprinkling portion regularly at the end of the predetermined process executed by the device in the prior stage.

Embodiment 8

A detoxifying device according to Embodiment 8 is the detoxifying device according to Embodiment 7, wherein the second stage sprinkling portion sprinkles the cleaning water in accordance with a timing when receiving a process gas stop signal from a device disposed in a prior stage or a subsequent stage of the detoxifying device. The timing is regarded as a timing when the treatment gas that causes generation of the solid product stops flowing.

The detoxifying device according to Embodiment 8 regards the timing when receiving the process gas stop signal output from the device in the prior stage of the detoxifying device, or the process gas stop signal from the device in the subsequent stage of the detoxifying device as the timing when the treatment gas that causes generation of the solid product stops flowing. The detoxifying device is capable of removing the solid product adhering by sprinkling the cleaning water from the first stage sprinkling portion regularly when the device in the prior stage stops supplying the treatment gas.

Embodiment 9

A detoxifying device according to Embodiment 9 is the detoxifying device according to any one of Embodiments 6 to 8, wherein the second stage sprinkling portion is included in the piping section.

In the detoxifying device according to Embodiment 8, the second stage sprinkling portion is included in the piping section. In the case of the corrosion that occurs in the part adjacent to the second stage sprinkling portion, the corroded part may be easily replaced.

Embodiment 10

A detoxifying device according to Embodiment 10 is the detoxifying device according to any one of Embodiments 1 to 9, wherein the first stage detoxifying portion keeps blowing drying gas when sprinkling of the cleaning water is suspended.

In the detoxifying device according to Embodiment 10, the first stage sprinkling portion blows the drying gas. This makes it possible to prevent the treatment gas from intruding into the first stage sprinkling portion when sprinkling of the cleaning water is suspended.

Embodiment 11

A detoxifying device according to Embodiment 11 is the detoxifying device according to Embodiment 10, wherein the drying gas is blown at a first flow rate constantly for a fixed period from the end of sprinkling the cleaning water, and after an elapse of the fixed period, the drying gas is blown at a second flow rate that is lower than the first flow rate.

In detoxifying device according to Embodiment 11, the flow rate of the drying gas blown from the first stage sprinkling portion for the fixed period from the end of sprinkling the cleaning water is higher than the flow rate of the drying gas blown from the first stage sprinkling portion after an elapse of the fixed period. As a result, at the end of sprinkling, the detoxifying device is capable of quickly dries the wall surface that has been wetted with the cleaning water.

Embodiment 12

A detoxifying device according to Embodiment 12 is the detoxifying device according to Embodiment 10 or 11, wherein inert gas is used as the drying gas.

The detoxifying device allows the use of easily available inactive gas as the drying gas.

Embodiment 13

A detoxifying device according to Embodiment 13 is the detoxifying device according to any one of Embodiments 1 to 12, further including a fan scrubber having a liquid supply passage for supplying the cleaning liquid, and a spray positioned downstream of the first stage sprinkling portion for sprinkling the cleaning water to remove the solid product adhering to the liquid supply passage.

In the detoxifying device according to Embodiment 13, the cleaning water sprinkled from the spray toward the liquid supply passage removes the solid product adhering to the liquid supply passage in the stream of the cleaning water. At this time, the cleaning water partially becomes droplets to adhere to a part on the inner wall adjacent to the spray. The treatment gas reacts with the droplets remaining on the part where the cleaning water flows at the low flow rate. The treatment gas reacted with the droplets may generate the solid product that will grow larger to cause clogging of the flow passage. The detoxifying device according to the present Embodiment 13 includes the first stage sprinkling portion upstream of the spray. This allows the detoxifying device to remove the solid product generated owing to the spray using the cleaning water sprinkled from the first stage sprinkling portion.

Embodiment 14

A detoxifying device according to Embodiment 14 is the detoxifying device according to Embodiment 13, wherein the fan scrubber includes a fan and a canned motor for rotating the fan.

In the detoxifying device according to Embodiment 14, the canned motor is used as the motor for rotating the fan of the fan scrubber. The canned motor is hardly brought into the failure caused by intrusion of the cleaning water into the canned motor.

Embodiment 15

According to Embodiment 15, a method of replacing a piping section of the detoxifying device is implemented. The detoxifying device includes an inner wall that forms a flow passage through which treatment gas flows, a first piping that forms a part of the flow passage, a replaceable piping section that forms a part of the flow passage at a position downstream of the first piping, is connected thereto, and includes a first stage sprinkling portion for sprinkling a cleaning water to remove a solid product adhering to the inner wall, and a second piping that forms a part of the flow passage at a position downstream of the piping section, and is connected thereto. The method includes a step of replacing the piping section.

With the method of replacing the piping section of the detoxifying device according to Embodiment 15, although corrosion occurs in the part adjacent to the first stage sprinkling portion resulting from removing the solid product adhering to the inner wall, the corroded part may be easily replaced by replacing the piping section. This allows the wall surface of the piping to be kept in the non-corroded state. It is therefore possible to restrain performance deterioration of the device or failure of the entire device owing to the corrosion in the wall surface of the piping.

Embodiment 16

According to Embodiment 16, a method of cleaning piping of the detoxifying device is implemented. The detoxifying device having an inner wall that forms a flow passage through which treatment gas flows includes a first stage sprinkling portion for sprinkling a cleaning water to remove a solid product adhering to the inner wall, a second stage sprinkling portion positioned upstream of the first stage sprinkling portion for sprinkling the cleaning water to remove the solid product adhering to the inner wall upstream of the first stage sprinkling portion, and a pressure sensor for measuring a pressure in the flow passage upstream of the first stage sprinkling portion. The method includes a step of sprinkling the cleaning water from the first stage sprinkling portion when the pressure sensor detects a pressure higher than a predetermined threshold value, and a step of sprinkling the cleaning water from the second stage sprinkling portion when the treatment gas that causes generation of the solid product stops flowing through the flow passage.

With the method of cleaning the piping of the detoxifying device according to Embodiment 16, clogging of the flow passage is indirectly detected based on the pressure. The first stage sprinkling portion ensures to prevent the solid product from causing clogging of the piping downstream of the first stage sprinkling portion. The second stage sprinkling portion sprinkles the cleaning water when the treatment gas that causes generation of the solid product stops flowing through the flow passage. The detoxifying device is capable of removing the solid product that has adhered by sprinkling of the cleaning water from the first stage sprinkling portion regularly at the end of the predetermined process executed by the device in the prior stage of the detoxifying device.

Although the embodiments of the present invention have been described above based on some examples, the described embodiments are for the purpose of facilitating the understanding of the present invention and are not intended to limit the present invention. The present invention may be modified and improved without departing from the spirit thereof, and the invention includes equivalents thereof. In addition, the elements described in the claims and the specification can be arbitrarily combined or omitted within a range in which the above-mentioned problems are at least partially solved, or within a range in which at least a part of the advantages is achieved.

REFERENCE SIGNS LIST

100 detoxifying device
101 gas suction port 102 gas discharge port
103 flow passage
104 inner wall
110 fan scrubber
111 casing
112 fan
113 liquid supply passage
115 canned motor
130 first piping
150 second piping
154 PFA coating
170 piping section
174 sprinkling portion
190 spray
210 heater
230 O-ring
250 clamp
300 detoxifying device
303 flow passage
304 inner wall
330 first piping
350 second piping
370 piping section
374 first stage sprinkling portion
375 second stage sprinkling portion
390 spray
410 heater
430 O-ring
450 clamp
490 pressure sensor

What is claimed is:

1. A detoxifying device having an inner wall that forms a flow passage through which treatment gas flows, the detoxifying device comprising:
 a first piping that forms a part of the flow passage;
 a replaceable piping section that forms a part of the flow passage at a position downstream of the first piping, and is connected to the first piping, the piping section having:
  a first stage sprinkling portion configured to sprinkle a cleaning water to remove a solid product adhering to the inner wall, and
  a second stage sprinkling portion positioned upstream of the first stage sprinkling portion and configured to sprinkle the cleaning water to remove the solid product adhering to the inner wall upstream of the first stage sprinkling portion;
 a second piping that forms a part of the flow passage at a position downstream of the piping section, and is connected to the piping section;
 a pressure sensor configured to measure a pressure in the flow passage upstream of the first stage sprinkling portion; and
 a controller configured to control sprinkling of the cleaning water from the first stage sprinkling portion and the second stage sprinkling portion such that the first stage sprinkling portion starts to sprinkle the cleaning water when the pressure sensor detects a pressure higher than a predetermined threshold value, and the second stage sprinkling portion starts to sprinkle the cleaning water when the treatment gas that causes generation of the solid product stops flowing through the flow passage.

2. The detoxifying device according to claim 1, further comprising a heater for heating the inner wall.

3. The detoxifying device according to claim 1, wherein the piping section is made of a corrosion-resistant metal.

4. The detoxifying device according to claim 1, wherein a PFA coating is applied to the inner wall corresponding to the second piping.

5. The detoxifying device according to claim 1, further comprising:
 an O-ring that tightly seals a joint between the piping section and the first piping or the second piping; and
 a clamp that brings the piping section in tight contact with the first piping or the second piping at the joint.

6. The detoxifying device according to claim 1, wherein the controller is configured to control sprinkling of the cleaning water from the first stage sprinkling portion and the second stage sprinkling portion such that the second stage sprinkling portion sprinkles the cleaning water in accordance with a timing when receiving a process gas stop signal from a device disposed in a prior stage or a subsequent stage of the detoxifying device, the timing being regarded as a timing when the treatment gas that causes generation of the solid product stops flowing.

7. The detoxifying device according to claim 1, wherein the second stage sprinkling portion is included in the piping section.

8. The detoxifying device according to claim 1, wherein the first stage sprinkling portion keeps blowing drying gas when sprinkling of the cleaning water is suspended.

9. The detoxifying device according to claim 8, wherein the drying gas is blown at a first flow rate constantly for a fixed period from when the sprinkling of the cleaning water is suspended, and after an elapse of the fixed period, the drying gas is blown at a second flow rate that is lower than the first flow rate.

10. The detoxifying device according to claim 8, wherein inert gas is used as the drying gas.

11. The detoxifying device according to claim 1, further comprising:
 a fan scrubber having a liquid supply passage for supplying a cleaning liquid; and
 a spray positioned downstream of the first stage sprinkling portion for sprinkling the cleaning water to remove the solid product adhering to the liquid supply passage.

12. The detoxifying device according to claim 11, wherein the fan scrubber includes a fan and a canned motor for rotating the fan.

13. A method of performing maintenance on the detoxifying device according to claim 1, the method comprising a step of replacing the piping section.

14. A method of operating the detoxifying device according to claim 1, the method comprising:
 a step of sprinkling the cleaning water from the first stage sprinkling portion when the pressure sensor detects the pressure higher than the predetermined threshold value; and
 a step of sprinkling the cleaning water from the second stage sprinkling portion when the treatment gas that causes generation of the solid product stops flowing through the flow passage.

* * * * *